(12) United States Patent
Nam et al.

(10) Patent No.: US 10,643,868 B2
(45) Date of Patent: May 5, 2020

(54) APPARATUS FOR PROCESSING SUBSTRATE

(71) Applicant: NPS Corporation, Hwaseong-Si, Gyeonggi-Do (KR)

(72) Inventors: Won Sik Nam, Hwaseong-Si (KR); Kang Heum Yeon, Hwaseong-Si (KR); Dae Seok Song, Hwaseong-Si (KR)

(73) Assignee: NPS Corporation (KR)

( * ) Notice: Subject to any disclaimer, the term of this patent is extended or adjusted under 35 U.S.C. 154(b) by 312 days.

(21) Appl. No.: 15/352,572

(22) Filed: Nov. 15, 2016

(65) Prior Publication Data
US 2017/0175264 A1  Jun. 22, 2017

(30) Foreign Application Priority Data

Dec. 21, 2015 (KR) .................. 10-2015-0183280

(51) Int. Cl.
| C23C 16/00 | (2006.01) |
| H01L 21/67 | (2006.01) |
| H01L 21/677 | (2006.01) |

(52) U.S. Cl.
CPC .. *H01L 21/67115* (2013.01); *H01L 21/67757* (2013.01)

(58) Field of Classification Search
CPC ............................................. H01L 21/67757
USPC ................................................ 118/728, 718
See application file for complete search history.

(56) References Cited

U.S. PATENT DOCUMENTS

| 2,369,764 A | * | 2/1945 | Ullrich, Jr. ............ C23C 14/044 |
| | | | 118/720 |
| 4,511,788 A | * | 4/1985 | Arai ...................... H05B 3/009 |
| | | | 219/405 |
| 4,632,624 A | * | 12/1986 | Mirkovich ............ H01J 37/20 |
| | | | 118/500 |
| 5,002,464 A | * | 3/1991 | Lee ....................... C23C 14/564 |
| | | | 417/152 |
| 5,332,557 A | * | 7/1994 | Sahoda ............. H01L 21/67115 |
| | | | 392/416 |

(Continued)

FOREIGN PATENT DOCUMENTS

| KR | 20130098664 | 9/2013 |
| KR | 101573035 | 12/2015 |

OTHER PUBLICATIONS

English translation KR 101573035, Nam, Dec. 2015 (Year: 2015).*
Office Action for Korean Application No. 10-2015-0183280, dated Feb. 3, 2016.

*Primary Examiner* — Keath T Chen
(74) *Attorney, Agent, or Firm* — Renaissance IP Law Group LLP

(57) ABSTRACT

The present invention relates to a substrate processing apparatus, comprising, a chamber comprising a base frame formed to open at least a part of faces extending in vertical direction and horizontal direction, a main heat source provided in a row with isolation on an opened face of the base frame, and a block which is connected to the opened face of the base frame and forms a space in the base frame in which the substrate is processed; and a substrate support portion which is provided in the chamber and supports the substrate, and by integrating the chamber and the heat source, the size of the chamber itself is reduced, the space can be used efficiently with reduced installation space, and facilities cost can be saved.

15 Claims, 10 Drawing Sheets

(56) References Cited

U.S. PATENT DOCUMENTS

| | | | |
|---|---|---|---|
| 5,850,071 A * | 12/1998 | Makiguchi | H01L 21/67109 |
| | | | 219/390 |
| 6,310,328 B1 * | 10/2001 | Gat | H01L 21/67115 |
| | | | 118/725 |
| 2001/0010307 A1 * | 8/2001 | Saito | C30B 31/12 |
| | | | 219/390 |
| 2008/0083109 A1 * | 4/2008 | Shibata | H01L 21/67126 |
| | | | 29/428 |
| 2011/0048991 A1 * | 3/2011 | Carcia | B65H 18/00 |
| | | | 206/387.1 |
| 2015/0361549 A1 * | 12/2015 | Strobl | C23C 16/458 |
| | | | 428/192 |

\* cited by examiner

200 : 210, 220, 230, 250

(a)

(b)

(a)  (b)

(c)

200 : 210, 220, 230, 250
150 : 152, 154, 156

APPARATUS FOR PROCESSING SUBSTRATE

CROSS-REFERENCE TO RELATED APPLICATION

This application claims priority to and the benefit of Korean Patent Application No. 10-2015-0183280 filed in the Korean Intellectual Property Office on Dec. 21, 2015, the entire contents of which are incorporated herein by reference.

TECHNICAL FIELD

The present invention disclosed herein relates to an apparatus for processing substrate, and more particularly, to an apparatus for processing substrate capable of improving the efficiency of processing substrate.

BACKGROUND ART

Recently, a rapid thermal processing (RTP) method is widely used as a method of heat treatment for substrate and the like.

The rapid thermal processing method is a method of heating up processing for substrate by illuminating radiation beam out of heat source like tungsten lamp onto substrate. Such a rapid thermal processing method has a merit that it can heat up or cool down a substrate more rapidly than a conventional method of heat treatment for a substrate using a furnace, and it can improve the quality of heat treatment for a substrate with easy adjustment control for pressure condition or temperature band.

A conventional substrate processing apparatus with which a rapid thermal processing method is used comprises a chamber providing a space in which a substrate is processed; a susceptor supporting the substrate in the chamber; and a heat source unit illuminating radiation beam to heat up the substrate. Here, the heat source unit may comprise a heating block for installation of a heat source and may be arranged along inside of the chamber.

Therefore, energy consumption is inevitable with a need for a heat source of higher output to process a substrate since not only the size of the chamber itself but also the distance between the heat source and the substrate is increased for securing an installation space of the heat source unit.

And as the substrate becomes of large area, the volume of a substrate processing apparatus for processing the substrate becomes increased rapidly. Usually a substrate is loaded into the chamber in horizontal direction and accordingly the size of the chamber in which the substrate is processed becomes increased. Therefore, there is a problem that price competitiveness falls owing to increased facilities cost with relatively wider space required for installation of the substrate processing apparatus and storage of the substrate of large area. And there is another problem that a uniform processing for overall substrate is difficult since a phenomenon occurs in which a substrate hangs downward owing to self weight of the substrate in case where a substrate of large area is loaded in horizontal direction.

On the other hand, graphene is a conductive substance with thickness of single layer of atom in which carbon atoms make an array of honeycomb shape in two-dimension and has been an important model for study of diverse nano phenomenon in low level. And the grapheme is a very excellent conductor as well as a very stable substance in structural and chemical sense, and is predicted as it can move an electron about 100 times more swiftly than silicon does and it can make about 100 times of electrons flow than copper does.

The grapheme has a merit that it can be processed very easily to single-dimensional or two-dimensional nano-pattern since it is made of only carbon which is a relatively light element. Especially in case that this merit is utilized, not only semiconductor-conductor characteristics can be adjusted, but also production of functional device of wide scope such as sensor, memory and the like becomes possible using diversity of chemical defect which carbon has.

However, a practical mass synthesis method for grapheme has not been introduced yet which is applicable to a real commercial use despite the excel lent electrical, mechanical and chemical merit that the grapheme has as stated above. Conventionally, a method is mainly known in which grapheme is mechanically ground and dispersed in a solution, and then is fabricated as a thin film using a self-assembly phenomenon. In this case, though there is a merit of low cost, it does not reach to the expectation of electrical and mechanical characteristics, since it is made as a structure in which numerous grapheme pieces are connected with overlapping one another. And there is a case in which a grapheme thin film is known as possible to be fabricated having conductivity similar to that of metal with introduction of a synthesizing technology of graphene of large area by chemical vapor deposition method introduced recently. However, there is also a problem that this also requires high cost and relatively high process temperature. Therefore, an effort is required for developing a synthesizing technology of grapheme of large area using the rapid thermal processing method which can provide the process temperature required in graphene synthesis.

RELATED ART DOCUMENT

Korean Laid-open patent gazette No. 2013-0098664 A

DISCLOSURE

Technical Problem

The present invention provides a substrate processing apparatus of which the cost for construct facilities is saved with reduction of size of the chamber and the installation space can be used efficiently.

The present invention provides a substrate processing apparatus which can process efficiently a substrate of large area.

The present invention provides a substrate processing apparatus which can increase the efficiency and productivity of the process facilities.

Technical Solution

A substrate processing apparatus according to an embodiment of the present invention may comprise a chamber comprising abase frame formed to open at least apart of faces extending in vertical direction and horizontal direction, a main heat source provided in a row with isolation on an opened face of the base frame, and a block which is connected to the opened face of the base frame and forms a space in the base frame in which the substrate is processed; and a substrate support portion which is provided in the chamber and supports the substrate.

The base frame may comprise an upper frame with a shape of polygon frame, a lower frame with shape corresponding to the upper frame, and a side frame with a shape of tetragonal frame connecting each of both end portions of the upper frame and the lower frame.

The block may comprise an upper block covering the upper frame, a lower block covering the lower frame, and a plurality of side block connecting an edge of the upper block and an edge of the lower block each other and covering the side frame.

The upper block may be connected to an upper portion of the upper frame in an attachable and detachable manner, and a gas supply unit for supplying cool down gas and substrate processing gas into the chamber may be provided at an upper portion of the upper block.

The lower block may be connected to a bottom portion of the lower frame, and a through hole may be formed at a center portion of the lower frame to connect to a gate which supports the substrate support portion and is opened and closed when the substrate is imported and exported.

A reflection body may be provided on the inner wall of the side block.

The main heat source may be provided to cut across inside of the side frame.

The main heat source may be provided at a different height each other to a heat source provided on a neighboring side frame.

The main heat source may be a lamp or a heating body emitting radiation beam.

The substrate processing apparatus may comprise an auxiliary heat source unit provided between the block and the substrate support portion.

The auxiliary heat source unit may comprise an auxiliary heat source which is arranged in a direction intersecting with the main heat source and encloses an outer side of the substrate support portion.

The auxiliary heat source may be a lamp or a heating body emitting radiation beam.

The substrate support portion may comprise a substrate support stanchion supporting the substrate, a stand on one side of which the substrate support stanchion is received safe, a support shaft which is provided as passing through the gate and supports the stand in the chamber being connected to the other side of the stand, and an actuator which is provided outside of the chamber and rotates the support shaft.

The substrate support stanchion may comprise an upper plate on which an inflow hole for gas to be flowed in is formed, a lower plate which is arranged as being isolated from the upper plate and on which an outflow hole for gas to be discharged is formed, a body comprising a rod which connects the upper plate and the lower plate each other, and a fixing member which is connected to the upper plate and the lower plate and fixing the substrate to enclose the body.

The fixing member may comprise a first fixing member which is arranged in a row to the rod and both ends of which is fixed to an outer side of the upper plate and the lower plate each, and a second fixing member which is provided in a row with isolation to the first fixing member and both ends of which is fixed to an outer side of the upper plate and the lower plate each.

The first fixing member may comprise a pair of fixing rod, and an isolation member provided between the fixing rods, wherein a gap being formed between the fixing rods into which one side of the substrate is inserted.

The second fixing member may comprise a fixing rod in which a fixing hole is formed with isolation along the longitudinal direction, and a fixing pin which is inserted into the fixing hole and fixes the other side of the substrate.

The second fixing member may be connected to be able to move along at least a part of a circumferential direction of the upper plate and the lower plate.

The substrate support stanchion may comprise an upper plate on which an inflow hole for gas to be flowed in is formed, a lower plate which is arranged as being isolated from the upper plate and on which an outflow hole for gas to be discharged is formed, a body comprising a rod which connects the upper plate and the lower plate each other and on which a slit is formed for one side of the substrate to be inserted along longitudinal direction, and a fixing member which is connected to the upper plate and the lower plate and fixes the other side of the substrate to enclose the rod.

The rod may be connected to either one of the upper plate and the lower plate to be able to be rotated.

The fixing member may comprise a fixing rod on which a fixing hole isolated along the longitudinal direction is formed, and a fixing pin which is inserted into the fixing hole and fixes the other side of the substrate.

The fixing member may be connected to be able to move along at least a part of a circumferential direction of the upper plate and the lower plate.

The substrate support portion may be provided to be able to move along the movement direction of the gate.

A discharge hole for gas to be discharged may be formed on the stand.

A temperature detector may be provided to the substrate support portion.

Advantageous Effects

According to a substrate processing apparatus according to an embodiment of the present invention, the size of the chamber itself can be reduced by integration of the chamber and the heat source. Therefore, space may be use efficiently with reduced installation space, and facilities cost may be saved.

And the processing efficiency of the substrate may be enhanced when processing the substrate such as graphene synthesis with reducing the distance between the heat source and the substrate. And a uniform processing on overall area of the substrate is possible with additionally providing an auxiliary heat source unit.

And a substrate of large area can be processed with ease with arrangement that the substrate encloses a cylinder-type substrate support stanchion. And a substrate can be loaded stably without a hanging phenomenon even when the substrate is thin and therefore, a uniform processing on overall substrate is possible without deformation and reliability of material such as graphene synthesized on the substrate may be improved.

BEST MODE

Before detailed description on embodiments of the present invention with reference to attached drawings, it should be noted that the detailed configurations and arrangements of configuration elements written in the detailed description or shown in drawings are not intended to limit the application of the present invention. The present invention may be embodied and implemented as other embodiments, and performed in a diverse way.

Here, it should be noted that any expression and predicate used in the application on the terms such as a direction of an apparatus or configuration element, for example 'front', 'back', 'up', 'down', 'top', 'bottom', 'left', 'right', 'lateral' and the like is used for only simplification of explanation of the present invention and do not show or mean that the related apparatus or element should have the only specific direction. And the terms like 'first' and 'second' are used in the application and attached claims for explanation, and do not intend to show or mean any relative importance or purpose.

And throughout the specification, unless explicitly described to the contrary, the word 'comprise' and variations such as 'comprises' or 'comprising' will be understood to imply the inclusion of stated elements but not the exclusion of any other elements.

Hereinafter, a substrate processing apparatus and a substrate processing method using the same according to exemplary embodiments of the present invention will be described with reference to the drawings.

Figure 1:
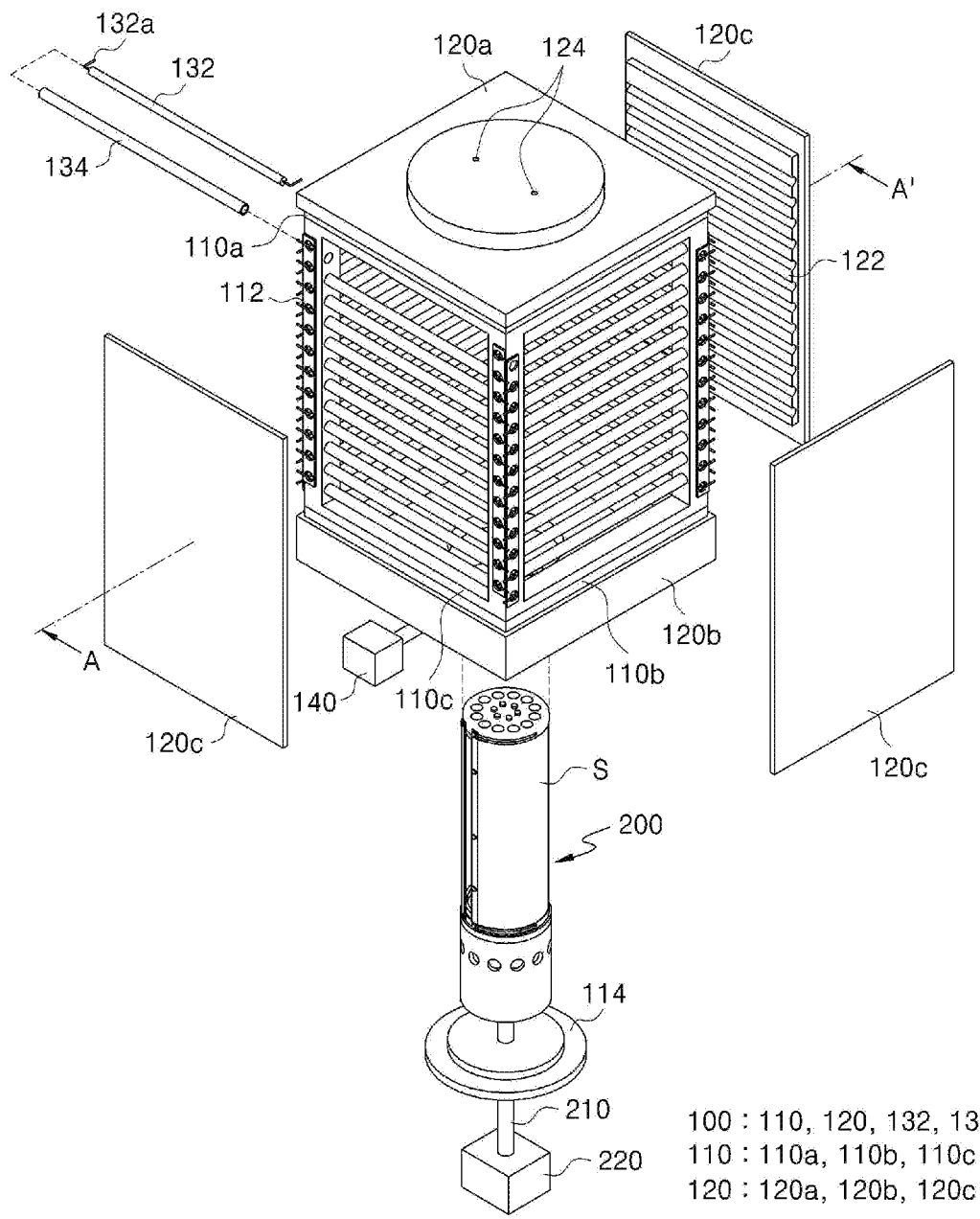
FIG. 1 is a disassembled perspective view of a substrate processing apparatus according to an embodiment of the present invention.
Figure 2:
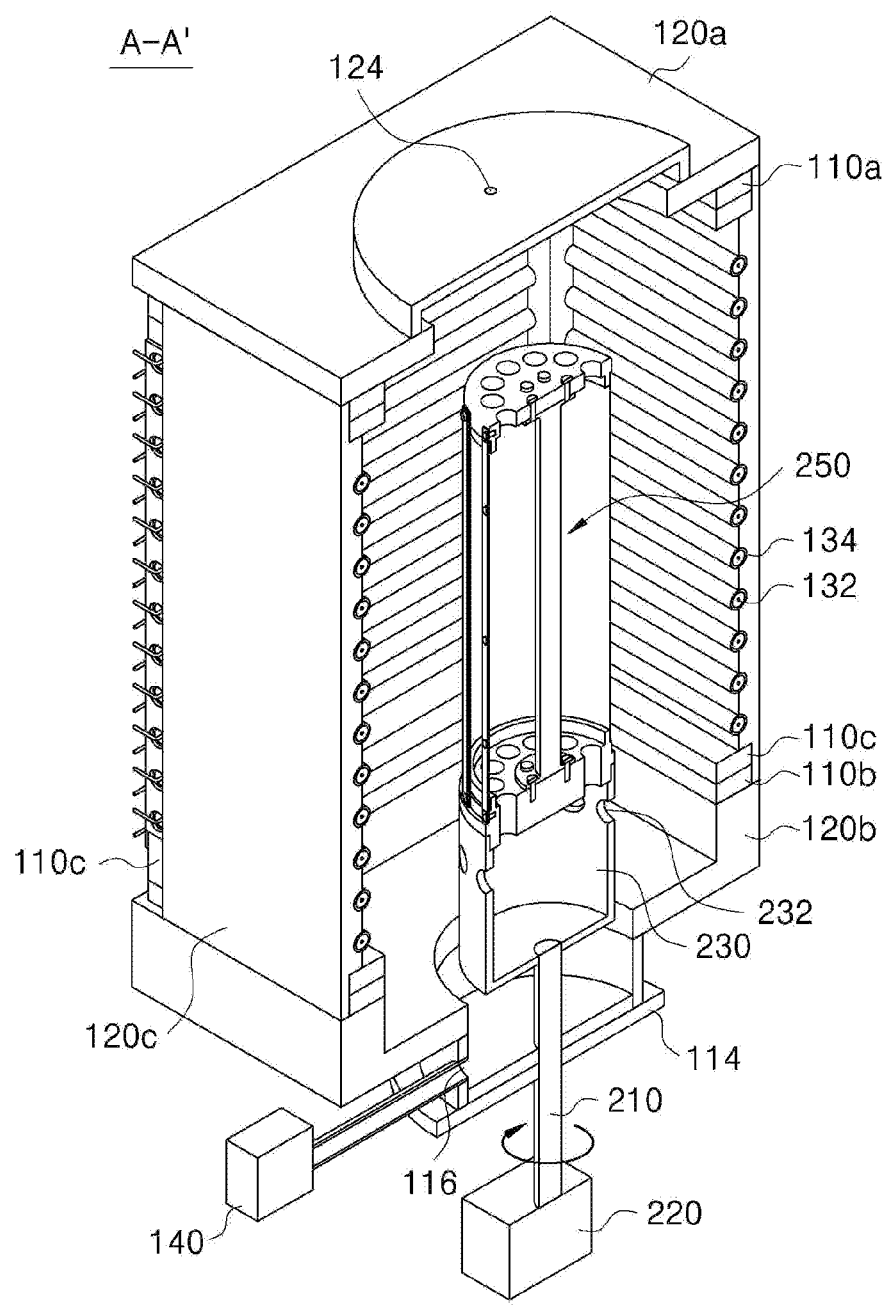
FIG. 2 is a drawing showing an inside structure of a substrate processing apparatus along line A-A shown in FIG. 1.
Figure 3:
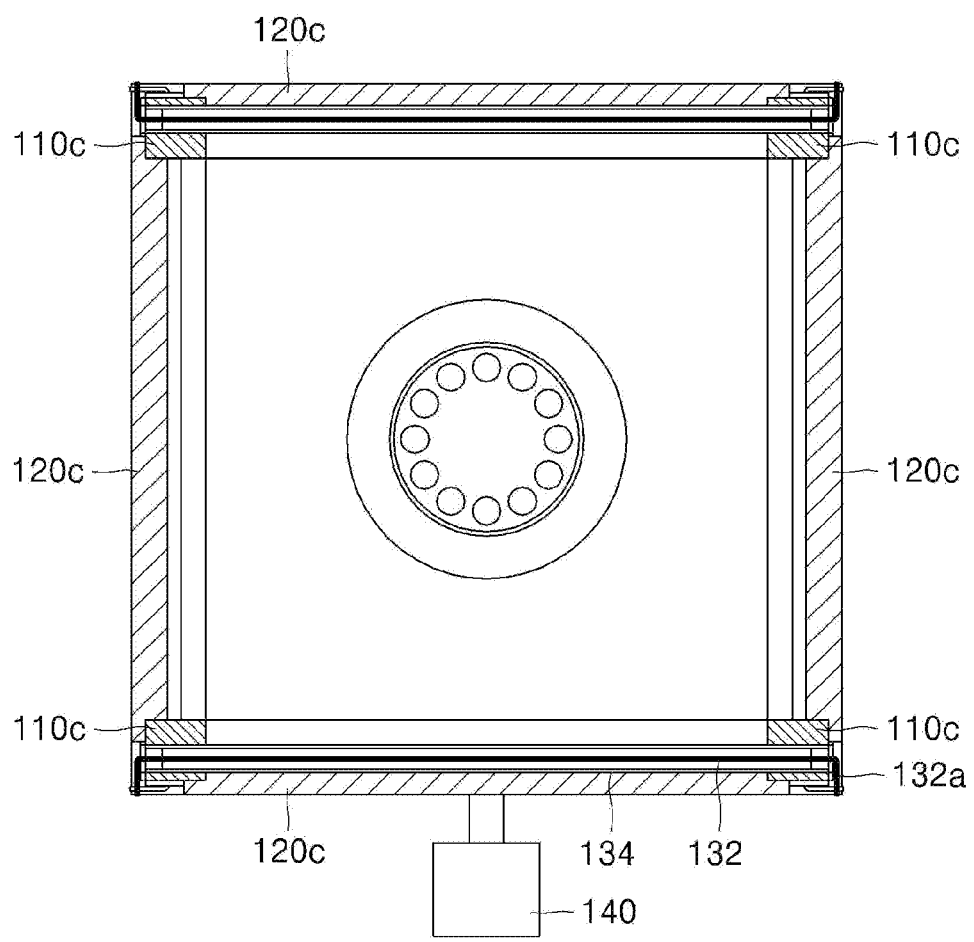
FIG. 3 is a transversal cross-sectional view of a substrate processing apparatus shown in FIG. 1.
Figure 4:
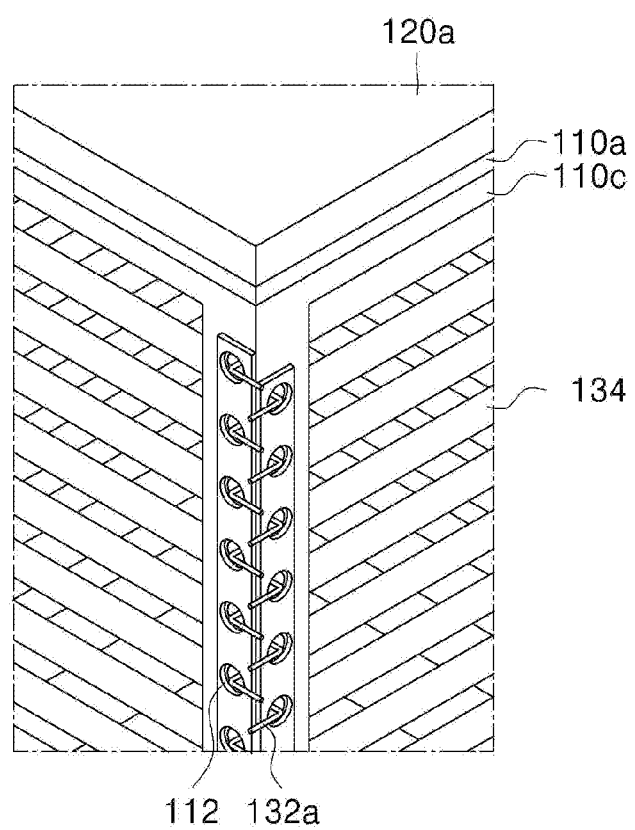
FIG. 4 is a drawing for explanation of arrangement state of a heat source provided in a substrate processing apparatus shown in FIG. 1.
Figure 5:
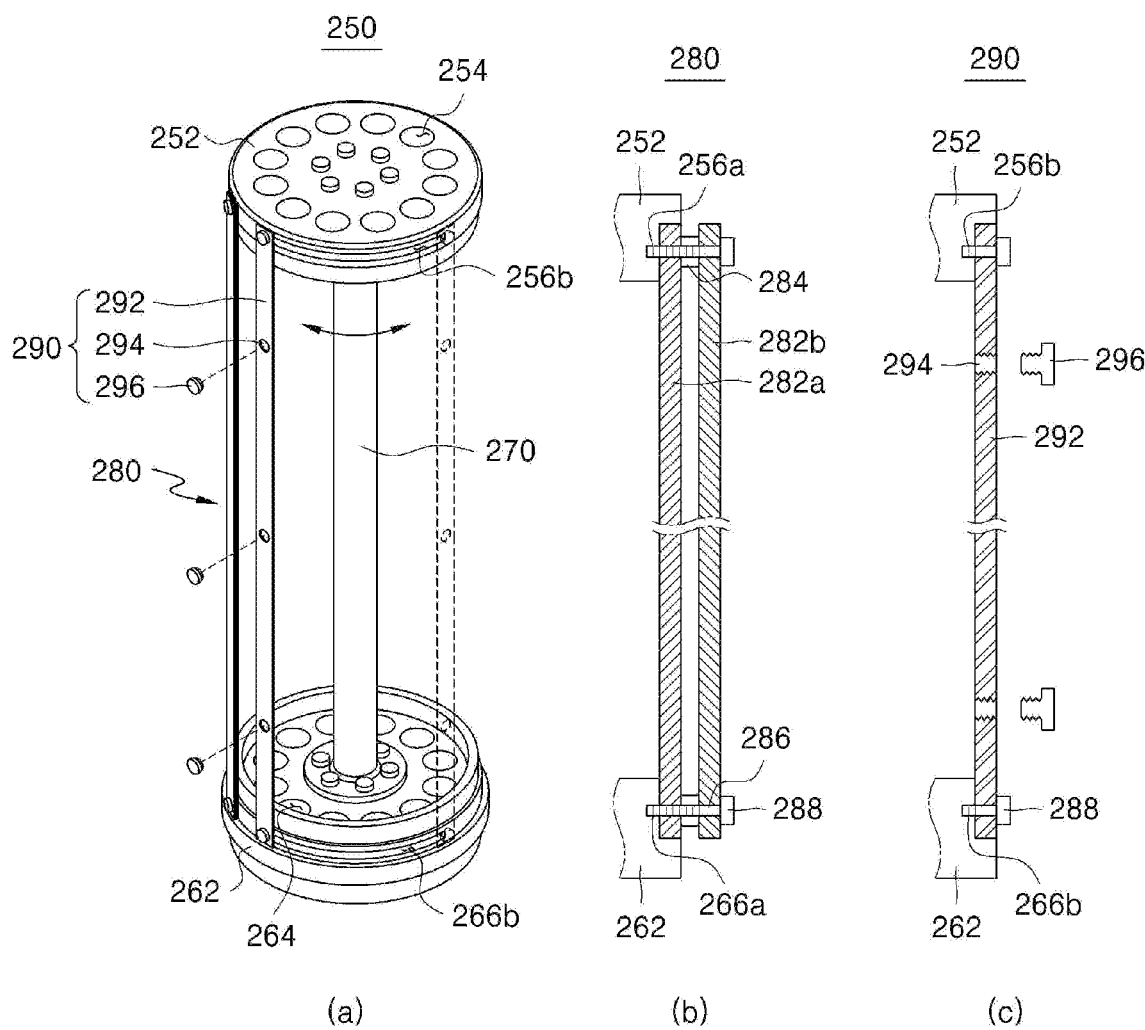
FIG. 5 is a drawing showing a configuration of a substrate support portion provided in a substrate processing apparatus according to an embodiment of the present invention.
Figure 6:
FIG. 6 is a drawing showing an installed state of a substrate on a substrate support portion according to an embodiment of the present invention.
Figure 6:
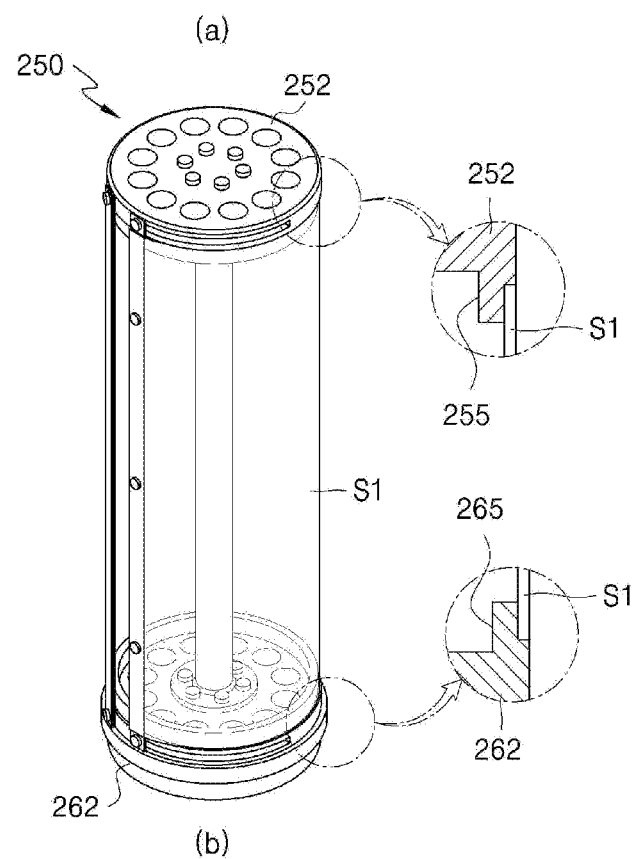
Figure 7:
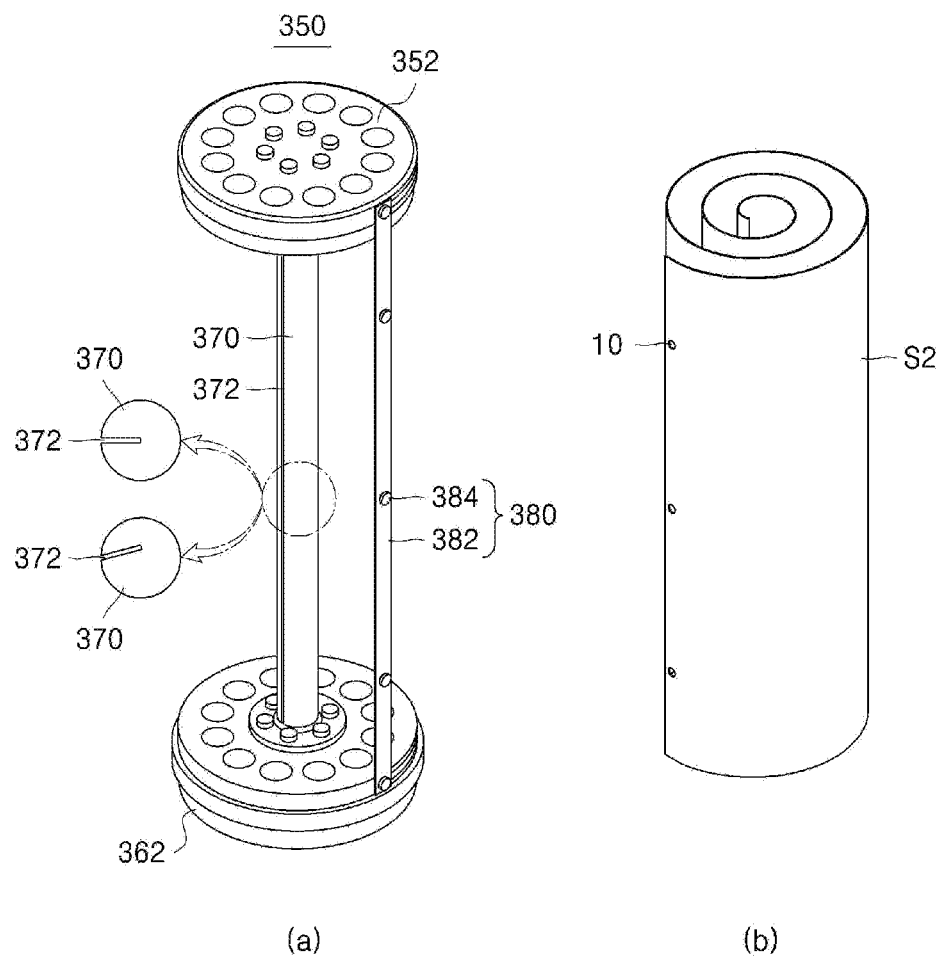
FIG. 7 is a drawing showing a modified example of a substrate support portion and an installation state of a substrate.
Figure 7:
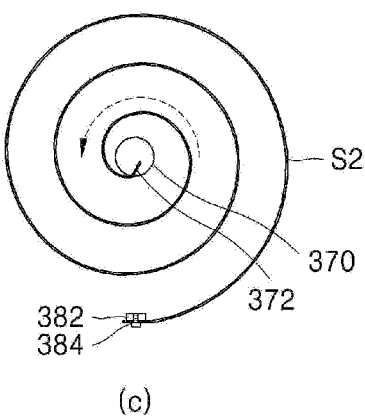

FIG. 1 is a disassembled perspective view of a substrate processing apparatus according to an embodiment of the present invention. FIG. 2 is a drawing showing an inside structure of a substrate processing apparatus along line A-A shown in FIG. 1. FIG. 3 is a transversal cross-sectional view of a substrate processing apparatus shown in FIG. 1. FIG. 4 is a drawing for explanation of arrangement state of a heat source provided in a substrate processing apparatus shown in FIG. 1. FIG. 5 is a drawing showing a configuration of a substrate support portion provided in a substrate processing apparatus according to an embodiment of the present invention. FIG. 6 is a drawing showing an installed state of a substrate on a substrate support portion according to an embodiment of the present invention. FIG. 7 is a drawing showing a modified example of a substrate support portion and an installation state of a substrate.

Referring to FIG. 1, a substrate processing apparatus according to an embodiment of the present invention is a heat treatment apparatus for processing a substrate of large area, for example a graphene synthesis, which may comprise a chamber 100 which forms a space for the substrate to be processed (hereinafter, 'substrate processing space') and is provided with a main heat source 132, and a substrate support portion 200 which supports the substrate in the chamber 100. Here, the substrate S may be used in at least one of nickel (Ni), copper(Cu), cobalt (Co), molybdenum (Mo), magnesium(Mg), platinum(Pt), silver(Ag), chrome (Cr), manganese(Mn), titanium(Ti) and tungsten(W), and may be formed in a shape of thin plate. By a configuration like this, the size of the substrate processing apparatus itself can be reduced with integral type formation of the chamber 100 and the main heat source 132. By this, the distance between the main heat source 132 and the substrate S is reduced, which result in an efficient processing of substrate S, or heat treatment. And the substrate processing apparatus enables processing of the substrate of large area by processing after fixing the substrate S to the substrate support portion 200 in a roll shape. Though the substrate support portion 200 is explained as being arranged in the chamber 100 in the vertical direction, the substrate support portion 200 may be arranged in the chamber 100 in the horizontal direction.

The chamber 100 is provided with a substrate processing space to accommodate the substrate S inside and do processing, for example heat treatment. Therefore, the chamber 100 may be formed in a shape of hollow box. Though the chamber 100 may be produced as one body, it may be formed with more than one configuration elements connected or assembled one another as in the embodiment.

The chamber 100 may comprise a base frame 110 defining the processing space, a plurality of block 120 which is connected to the base frame 110 and seals the processing space, and a gate 114 which opens and closes the processing space.

The base frame 110 is formed to open at least a part of faces extending in the vertical direction and the horizontal direction, and may comprise an upper frame 110a with a shape of for example tetragonal frame, a lower frame 110b provided to be formed with a shape corresponding to the upper frame 110a and to be isolated in the vertical direction against the upper frame 110a, and a side frame 110c connecting each of both end portions of the upper frame 110a and the lower frame 110b. Here, the side frame 110c may be formed with a shape of tetragonal frame connecting each edge of the upper frame 110a and the lower frame 110b. Through the configuration like this, the base frame 110 may form the processing space with a shape of rectangular parallelepiped with upper portion, lower portion and each of side portion is opened.

An insertion hole 112 may be formed for installation of a maim heat source 132 onto the base frame 110. The insertion hole 112 may be formed on the side frame 110c which belongs to the base frame 110, and may be formed in plurality with isolation along the longitudinal direction, for example the vertical direction of the side frame 110c. As stated above, the side frame 110c may comprise two vertical frames which extend in the vertical direction facing each other, and two horizontal frames which connect the two vertical frames each other extending in the horizontal direction. Therefore, the insertion hole 112 may be formed on two vertical frames which configure the side frame 110c, and may be formed on two vertical frames to face each other.

A floodlighting tube 134 is inserted in a insertion hole formed on the side frame 110*c*, and both end portions of the floodlighting tube 134 may be inserted each in the insertion hole 112 facing each other. Therefore, the floodlighting tube 134 may be provided to connect two vertical frames (not shown) each other by being arranged to cut across the side frame 110*c*, or in an aligned direction to the horizontal frame (not shown). Therefore, the floodlighting tube 134 may be arranged on the side frame 110*c* in an aligned manner with isolation in the longitudinal direction of the side frame 110*c*, or in the longitudinal direction of the vertical frame. The floodlighting tube 134 is connected to the side frame 110*c* tightly, after that, in case the processing space is formed in the chamber 100 by connecting a block 120 to the base frame 110, the processing space and the outside can be blocked completely. The floodlighting tube 134 may be formed with a material capable of penetrate radiation beam or heat emitted from the main heat source 132 with good penetrability and good thermal resistance like quartz and sapphire.

The main heat source 132 may be inserted in the insertion hole 112 formed to face each other on two vertical frame. A lamp emitting radiation beam or a heating body generating heat with application of electric power may be used as the main heat source 132.

Through the configuration like this, the main heat source 132 may be formed to be connected to each of a plurality of side frame 110*c* which connect the upper frame 110*a* and the lower frame 110*b* together and to enclose the processing space formed in the chamber 100.

Referring to FIG. 4, the main heat source 132 of neighboring side frames 110*c*, for example the main heat source 132 provided on each of a side frame 110*c* forming a front face of the chamber 100 and a side frame 110*c* forming a side face at one side of the side frame 110*c* may be arranged at a different height to each other. That is, the main heat source 132 may be arranged in zigzag at a different height to each other to a neighboring main heat source 132. This is because wiring connection is difficult for application of electric power in case that two side frames 110*c* are formed at the same height since electrodes 132*a* formed on both end portions of the main heat source 132 are exposed through a connecting part of two side frames 110*c*. Therefore, wiring can be connected with ease with having electrodes 132*a* of each main heat source 132 being arranged at a different height to each other by arranging neighboring main heat sources 132 at a different height to each other. And this can have heat generated by the main heat source 132 be distributed uniformly in the longitudinal direction of the side block 120*c*, or in the longitudinal direction of the chamber 100 and can suppress the deformation of the chamber 100 generated by heat nonuniformity and can do uniform heat treatment of the substrate.

The block 120 may be provided on an opened face of the base frame 110 and form the processing space, and may comprise an upper block 120*a* connected to an upper portion of the base frame 110, a lower block 120*b* connected to a bottom portion of the base frame 110, and a side block 120*c* connected each of side portion of the base frame 110.

Here, the upper block 120*a* is provided to be connected to the upper portion of the upper frame 110*a* in a attachable and detachable manner to be able to open or seal inside of the chamber 100. The upper block 120*a* may be formed in a shape corresponding to the upper frame 110*a*, for example in a shape of tetragonal plate, and an injection hole 124 may be formed on the upper block 120*a* for cool down gas or processing gas for graphene synthesis is injected into the chamber 100. And a gas supply unit (not shown) may be provided on an upper portion of the upper frame 110*a* for supplying cool down gas and substrate processing gas. Here, the processing gas may be a gas containing carbon like $CH_4$, $C_2H_6$, $C_2H_2$, $C_6H_6$.

The lower block 120*b* may be connected to a bottom portion of the lower frame 110*b*, and may be formed in a shape corresponding to the lower frame 110*b*, for example in a shape of tetragonal plate. A through hole (not shown) for a gate 114 is connected may be formed on a center portion of the lower block 120*b*. The gate 114 supports the substrate support portion 200 and is opened and closed when the substrate is imported and exported. The gate 114 may be formed in a shape corresponding to the through hole, for example in a shape of circular plate. A support shaft 210 supporting the substrate support portion 200 is connected in a rotatable manner passing through the center portion of the gate 114 in the vertical direction. And a lift (not shown) which opens and closes the through hole by moving the gate 114 in the vertical direction may be connected to the gate 114, and a detailed explanation on the lift is omitted since it is a publicly known technology.

And an exhaustion hole 116 may be formed on the lower block 120*b* to discharge cool down gas or substrate processing gas supplied in the chamber 100. The exhaust ion hole 116 may be connected to a vacuum generation member 140 provided outside of the chamber 100, and may discharge cool down gas and substrate processing gas in the chamber 100 to generate vacuum in the chamber when process the substrate.

The side block 120*c* may be formed in a shape of tetragonal frame to connect to a neighboring upper frame 110*a*, lower frame 110*b*, and neighboring side frame 110*c*. Here, a reflection body 122 may be provided on a inner wall of the side block 120*c* for collection of light of radiation beam or heat emitted from the main heat source 132 toward the substrate. The reflection body 122 may be formed of material of good reflectivity capable of reflecting radiation beam, and may be formed of ceramic or metal material like Ni or Ni/Au alloy. The reflection body 122 may be formed in a shape of flat plate and may be formed in a shape of plate formed with concavo-convex structure corresponding to the shape of the main heat source 132 to collect radiation beam emitted from the main heat source 132 to illuminate toward the substrate. The side block 120*c* may form a side face of the chamber 100 and be provided to enclose the main heat source 132.

Through the configuration like this, the size of the chamber 100 can be reduced compared to a conventional technology having a separate heat source unit outside of the chamber 100 with forming the main heat source 132 in an integral type with chamber 100, or the side frame 110*c*. And the efficiency of heat treatment of the substrate can be improved since radiation beam or heat emitted from the main heat source 132 can reach smoothly with reducing the distance between the main heat source 132 and the substrate S.

A substrate support portion 200 may be provided in the chamber 100. The substrate support port ion 200 may be formed as movable in the vertical direction and rotatable in the chamber 100.

The substrate support portion 200 may comprise a substrate support stanchion 250 supporting the substrate, a stand 230 receiving the substrate support stanchion 250 safely in its upper portion, and a support shaft 210 supporting the stand 230 in the chamber 100.

The stand 230 is supported in the chamber 100 with being connected to the support shaft 210. The stand 230 may be formed in a shape of hollow cylinder with upper portion opened, and at least one discharge hole 232 may be formed on a side wall along the circumferential direction. The discharge hole 232 can discharge processing gas and cool down gas supplied in the chamber 100 with being formed with a predetermined spacing along the circumferential direction of the stand 230. Processing gas and cool down gas discharged through the discharge hole 232 can be discharged outside through the exhaustion hole 116 formed on the lower block 120b.

A support shaft 210 may be connected to a lower portion of the stand 230. The support shaft 210 may be provided to pass through the gate 114 combined to the lower block 120b, and an upper port ion may be arranged inside of the chamber 100 and a lower portion may be arranged outside of the chamber 100. An actuator 220 may be connected to the support shaft 210 for providing rotation force, and the support shaft 210 may be rotated by the movement of the actuator 220. Therefore, the stand 230 connected to the support shaft 210 and the substrate support stanchion 250 received safely to the stand 230 are also rotated by the rotation of the support shaft 210.

The gate 114 may be connected to the lift 40 provided to outside of the chamber 100 and may move in the vertical direction, and the substrate support portion 200 connected to the gate 114 via the support shaft 210 may move in the vertical direction along the movement direction of the gate 114. Therefore, import and export of the substrate is enabled by moving the substrate support portion 200 supported by the gate 114 in the vertical direction via driving the lift 40.

The substrate support stanchion 250 may support the substrate and may be received safely to an upper portion of the stand 230. The substrate support stanchion 250 may be connected to be able to separate from the stand 230. Referring to FIG. 5, the substrate support stanchion 250 may comprise a body supporting the substrate, and a fixing member fixing the substrate to the body.

Referring to FIG. 5(a), the body may comprise an upper plate 252, a lower plate 262, and a rod 270 to connect the upper plate 252 and the lower plate 262 together. The upper plate 252 may be formed in a shape of circular plate having a predetermined thickness. An inflow hole 254 passing through the upper plate 252 in the vertical direction may be formed on the upper plate 252. The inflow hole 254 may be formed in plurality with isolation by a predetermined spacing in a radial pattern based on the center of the upper plate 252. And an upper raised sill may be formed on an outer circumferential face of the upper plate 252 to be able to support the substrate. The upper raised sill may be formed on ½ region with respect to the thickness of the upper plate 252, for example at lower side, and may be formed in a dented shape inward of the upper plate 252 with the diameter being reduced than the upper side. And a first fixing groove 256a and a second fixing groove 256b may be formed onto an upper side of an outer circumferential face of the upper plate 252 for installation of the fixing member. Here, the first fixing groove 256a may be formed as a circular groove formed with a screw thread on an inner circumferential face for a fixing member like a bolt to be able to be inserted, and the second fixing groove 256b may be formed in a shape of slit formed along at least apart of an outer circumferential face of the upper plate 252. The second fixing groove 256b is formed to be able to change the position of the fixing member according to the size of the substrate fixed to the substrate support stanchion 250, whose detail may be explained later.

The lower plate 262 may be formed in a shape of circular plate, and may be formed in the same size as that of the upper plate 252. An outflow hole 264 passing through the lower plate 262 in the vertical direction may be formed on the lower plate 262. The outflow hole 264 may be formed in plurality with isolation by a predetermined spacing in a radial pattern based on the center of the lower plate 262. And a lower raised sill may be formed on an outer circumferential face of the lower plate 262 to be able to support the substrate. The lower raised sill may be formed on ½ region with respect to the thickness of the lower plate 262, for example at upper side, and may be formed in a dented shape inward of the lower plate 262 with the diameter being reduced than the lower side. And a third fixing groove 266a and a fourth fixing groove 266b may be formed onto a lower side of an outer circumferential face of the lower plate 262 for installation of the fixing member, and the third fixing groove 266a and the fourth fixing groove 266b may be formed at a position corresponding to the first fixing groove 256a and the second fixing groove 256b respectively formed on the upper plate 252. Here, the third fixing groove 266a may be formed as a circular groove formed with a screw thread on an inner circumferential face for a fixing member like a bolt to be able to be inserted, and the fourth fixing groove 266b may be formed in a shape of slit formed along at least a part of an outer circumferential face of the lower plate 262. The fourth fixing groove 266b is also formed to be able to change the position of the fixing member according to the size of the substrate fixed to the substrate support stanchion 250 like the second fixing groove 256b, whose detail may be explained later.

The upper plate 252 and the lower plate 262 formed like the above, may form a body in a shape of dumbbell with being connected to each of upper portion and lower portion of the rod 270 formed in a shape of cylinder.

The fixing member may comprise a first fixing member 280 and a second fixing member 290.

Referring to FIG. 5(b), the first fixing member 280 may comprise a pair of first fixing rod 282a, 282b formed in a shape of bar, an isolation member 284 provided between the first fixing rods 282a, 282b, and a pair of first fixing pin 288 for connecting the first fixing rods 282a, 282b to the upper plate 252 and the lower plate 262. Therefore, a predetermined gap may be formed between the first fixing rods 282a, 282b. The gap formed between the first fixing rods 282a, 282b is for inserting and supporting one side of the substrate. A pair of first fixing hole 286 arranged with isolation along the longitudinal direction may be formed on the first fixing rod 282a, 282b. One end of the first fixing member 280 may be connected to the upper plate 252 by combining the first fixing pin 288 to the first fixing groove 256a through one of a pair of first fixing hole 286, for example the first fixing hole 286 formed at an upper side, and the other end of the first fixing member 280 may be connected to the lower plate 262 by connecting the first fixing pin 288 to the third fixing groove 266a through one of first fixing hole 286, for example the first fixing hole 286 formed at an lower side.

Referring to FIG. 5(c), the second fixing member 290 may comprise a second fixing rod 292 formed in a shape of bar, and a second fixing pin 296. A plurality of second fixing hole 294 arranged with isolation along the longitudinal direct ion may be formed on the second fixing rod 292. One end of the second fixing member 290 may be connected to the upper plate 252 by combining one of a plurality of second fixing pin 296 to the second fixing groove 256b through one of a plurality of second fixing hole 294, and the other end of the second fixing member 290 may be connected to the lower plate 262 by combining one of a plurality of second fixing pin 296 to the fourth fixing groove 266b through one of a plurality of second fixing hole 294. Through the configuration like this, the first fixing member 280 and the second fixing member 290 may be provided in a row to the body of the substrate support stanchion 250. Here, the second fixing member 290 may be connected for the second fixing pin 296 to be able to move along the second fixing groove 256b and the fourth fixing groove 266b. and the position may be changed according to the size of the substrate fixed on the substrate support stanchion 250.

For example, in case of small size of substrate, the second fixing member 290 may be moved to the opposite direction to the first fixing member 280 to make the distance between the first fixing member 280 and the second fixing member 290 increased, and in case of large size of substrate, the second fixing member 290 may be moved toward the first fixing member 280 to make the distance between the first fixing member 280 and the second fixing member 290 decreased.

A temperature detector (not shown) may be provided to the substrate support stanchion 250 for measuring the temperature of the space within which the substrate is processed. The temperature detector may be provided at least one place of the upper plate 252, the lower plate 262 and the rod 270 of the substrate support stanchion 250 and can measure the temperature of the processing space. And the temperature of the processing space may be controlled to be of about from 800 to 1050° C. by adjusting the electric power applied to the main heat source 132 using the result measured by the temperature detector.

Referring to FIG. 6, a method for fixing the substrate to the substrate support stanchion 250 will be explained. Referring to FIG. 6(a), the substrate S1 may be formed in a shape of plate extending in one direction having length. Here, length means the size in the vertical direction and width means the size in the horizontal direction. The substrate may be metal like copper(Cu), nickel(Ni), molybdenum(Mo), magnesium(Mg), iron(Fe), platinum(Pt), silver(Ag), aluminum(Al), chrome(Cr), manganese(Mn), titanium(Ti) and tungsten(W), may be in a shape of bendable thin plate. When the substrate is prepared, as shown in FIG. 6(b), one side of the substrate is inserted and supported into the gap formed at the first fixing member 280, the substrate is wound along the circumferential direction of the body of the substrate support stanchion 250, and then the other side of the substrate is fixed to the second fixing member 290. Here, a plurality of through hole 10 isolated along the longitudinal direction may be formed on the other side of the substrate. The through holes 10 may be formed in the same number as the number of remainder of the second fixing hole 294 except the number of the second fixing hole 294 for fixing the second fixing member 290 to the body of the substrate support stanchion 250. The through hole 10 may be formed to correspond to the position on which the second fixing hole 294 is formed. When the substrate S1 is wound along the circumferential direction of the body, the upper portion of the substrate may be supported by a first raised sill 255 formed on an outer circumferential face of the upper plate 252, and the lower portion of the substrate may be supported by a second raised sill 265 formed on an outer circumferential face of the lower plate 262. Therefore, the substrate may be supported in a shape of roll enclosing at least a part of the substrate support portion 200 along a circumferential direction of the body of the substrate support portion 200.

The structure of the substrate support stanchion 250 like the above can be applied to a case where the size of the substrate, for example the length in width direction is smaller than the circumferential length of the upper plate 252 or the lower plate 262.

On the other hand, the size of the substrate S2 is larger than the circumferential length of the upper plate 352 of the lower plate 362, the structure of the substrate support stanchion can be modified as follows:

Referring to FIG. 7(a), the substrate support stanchion 350 may comprise a body 352, 362, 370 supporting the substrate S2, and a third fixing member 380 fixing the substrate to the body. Here, the body may comprise an upper plate 352, a lower plate 362, and a rod 370 connecting the upper plate 352 and the lower plate 362 together, and the structure has a difference in a part to the above-mentioned embodiment. And the third fixing member 380 may comprise a fixing rod 382 and a fixing pin 384 like in the above-mentioned second fixing member 290. In this modified example, the size of the substrate is larger than the circumferential length of the upper plate 352 or the lower plate 362. For this reason, the substrate is not fixed to enclose the body of the substrate support stanchion 350 as in the above-mentioned embodiment, but the substrate may be wound with overlapping several times inside the body in a shape of roll, for example in a shape of scroll as shown in FIG. 7(b) and FIG. 7(c). Therefore, the raised sill may be removed formed at the upper plate 352 and the lower plate 362 each for arranging the substrate in the body in a shape of scroll. And a slit 372 in which one side of the substrate can be inserted along the longitudinal direction of the rod 370 may be formed on the rod 370. The slit 372 may be formed facing the center of the rod 370 and may be formed to be oblique having an angle. And the rod 370 may be connected to the upper plate 352 or the lower plate 362 in a rotatable manner. When the substrate is fixed to the substrate support stanchion 350, one side of the substrate is inserted to the slit 372 formed on the rod 370 and then the upper plate 352 or the lower plate 362 is rotated. Then the rod 370 is rotated with the state of one side of the substrate being inserted, and the substrate is wound to have a scroll shape and enclose the rod 370. Here, the substrate is arranged in the body, and after the substrate being wound, the other side of the substrate is fixed to the body using the third fixing member 380. For the part facing each other when fixing the substrate to have a even spacing, a groove in a spiral shape may be formed on the bottom face of the upper plate and the upper face of the lower plate.

Hereinafter, a substrate processing apparatus according to a modified example of the present invention will be described.

Figure 8:
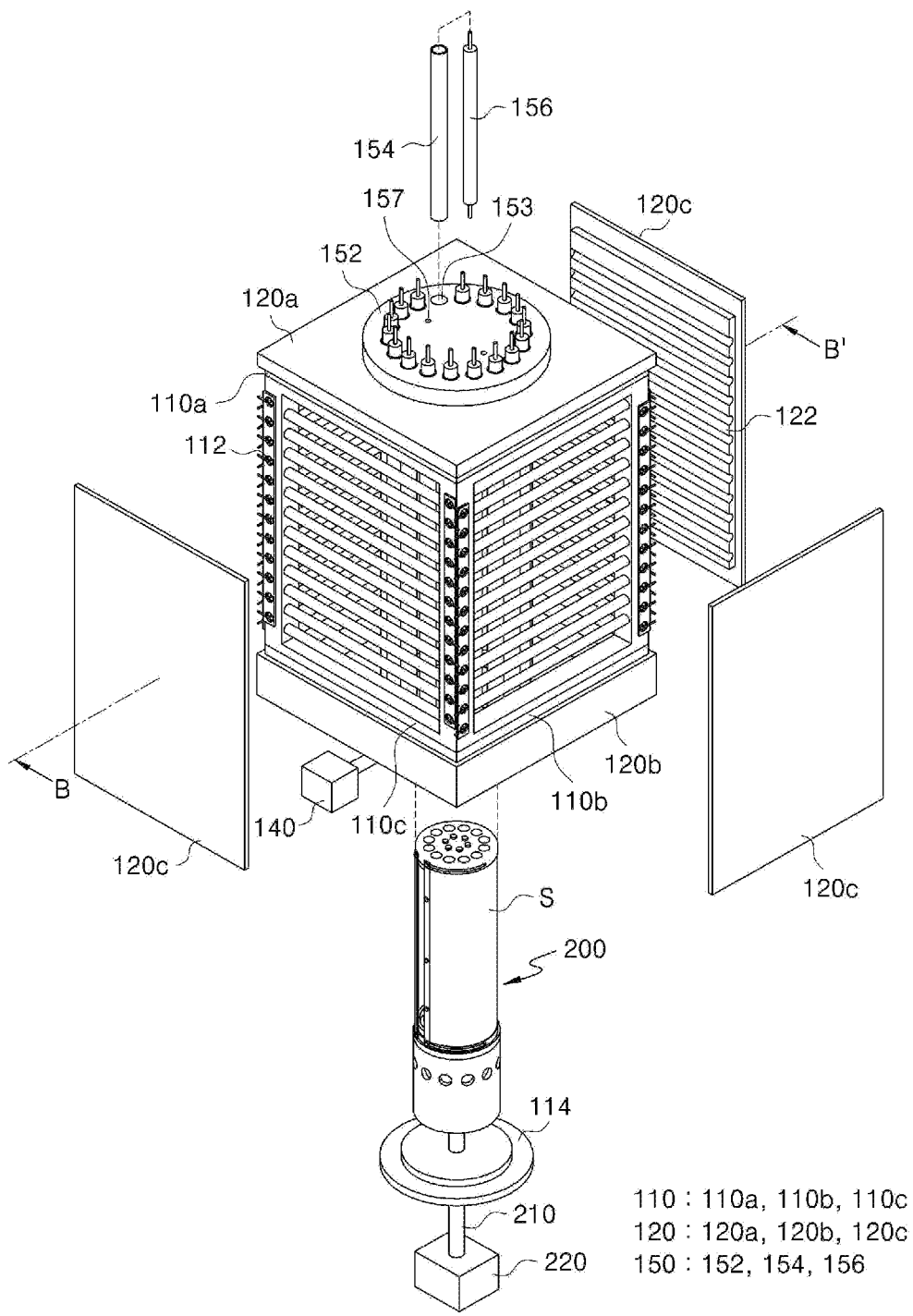
FIG. 8 is a disassembled perspective view of a substrate processing apparatus according to a modified example of the present invention.
Figure 9:
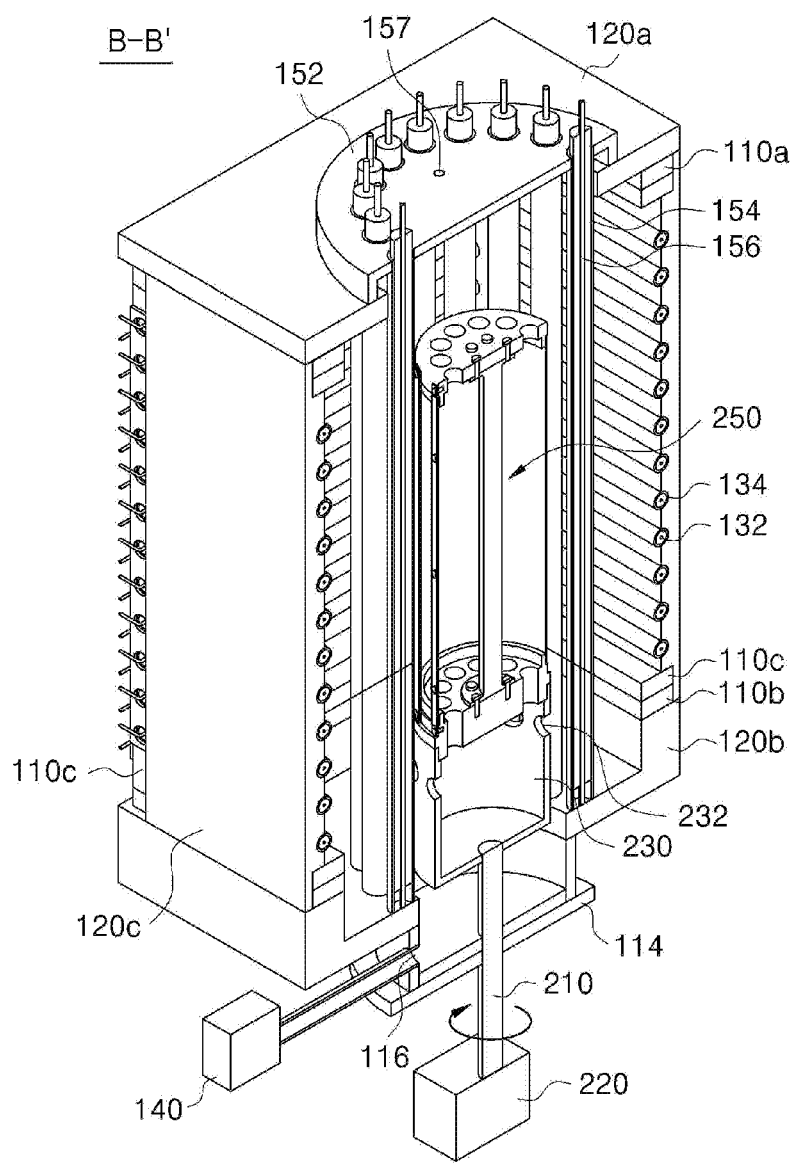
FIG. 9 is a drawing showing an inside structure of a substrate processing apparatus along line B-B shown in FIG. 8.
Figure 10:
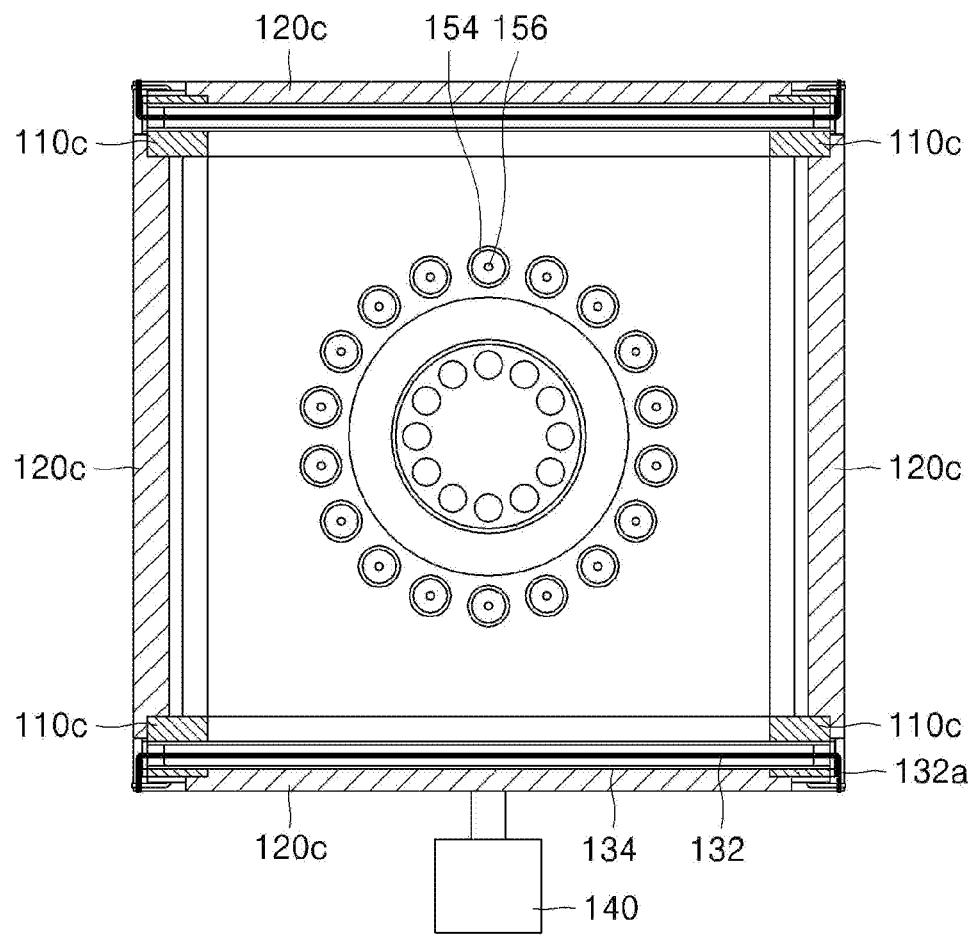
FIG. 10 is a transversal cross-sectional view of a substrate processing apparatus shown in FIG. 8.

FIG. 8 is a disassembled perspective view of a substrate processing apparatus according to a modified example of the present invention. FIG. 9 is a drawing showing an inside structure of a substrate processing apparatus along line B-B shown in FIG. 8. FIG. 10 is a transversal cross-sectional view of a substrate processing apparatus shown in FIG. 8.

Referring to FIG. 8 to FIG. 10, a substrate processing apparatus according to a modified example of the present invention may be formed almost the same structure as the substrate processing apparatus according to an embodiment of the present invention described above, except that an auxiliary heat source unit 150 is provided in the chamber 100. Hereinafter, the configuration and installation position of the auxiliary heat source unit 150 will be described concretely.

The auxiliary heat source unit 150 may be provided to enclose the substrate support portion 200 in the chamber 100. The auxiliary heat source unit 150 may be formed in a shape of hollow cylinder with for example the upper portion and the lower portion opened.

The auxiliary heat source unit 150 may be supported in the chamber 100 by the upper block 120a and the lower block 120b. The auxiliary heat source unit 150 may comprise an auxiliary heat source 156, a support plate 152 for supporting the auxiliary heat source 156, and a floodlighting tube 154 which is connected to the support plate 152 and in which the auxiliary heat source 156 is inserted.

First, the support plate 152 may be connected to the upper block 120a, and the upper block 120a may be formed in a shape having the center portion opened for installing the support plate 152. The support plate 152 may be formed in a shape corresponding to the opened part in the upper block 120a, for example in a circular shape, and may be fixed with being combined to the opened part of the upper block 120a.

A fixing hole 153 to insert and fix a floodlighting tube 154 for insertion of auxiliary heat source 156 may be formed on the support plate 152 and an injection hole 157 to supply cool down gas or substrate processing gas into the chamber 100 may be formed on the support plate 152. The fixing hole 153 may be formed in plurality in a radial pattern based on the center of the support plate.

One side of the floodlighting tube 154, for example an upper portion may be inserted in the fixing hole 153 of the support plate 152, and the other side of the floodlighting tube 154, for example a lower portion may be connected to the lower block 120b. Here, a fixing hole (hot shown) for inserting and fixing the floodlighting tube 154 may be formed on the lower block 120b at a position corresponding to the fixing hole 153 formed on the support plate 152. The floodlighting tube 154 may block the inside of the chamber 100 from outside completely with providing a sealing member (not shown) at a connection part to the support plate 152 and the lower block 120b.

The auxiliary heat source 156 may use a lamp emitting radiation beam or heating body generating heat like the main heat source 132. The auxiliary heat source 156 may be formed in a shape of bar, and may be inserted in the floodlighting tube 154 and may be arranged in a direction intersecting with the main heat source 132, for example in a perpendicular direction or in the longitudinal direction of the chamber 100.

On the other hand, since the base frame 110 on which the main heat source 132 is installed is formed in a shape polyhedron, heating up the substrate supported in a shape of roll at the substrate support stanchion 250 at the same distance is almost impossible. Therefore, the auxiliary heat source 156 can heat up the whole region of the substrate at the same distance with arrangement of enclosing the substrate support portion 200, desirably the substrate support stanchion 250. Therefore, heat nonuniformity which may be occur according to the difference of distance between the main heat source 132 and the substrate can be solved.

Hereinafter, an experiment example for verifying the effect of the substrate processing apparatus according to an embodiment of the present invention will be described.

Figure 11:
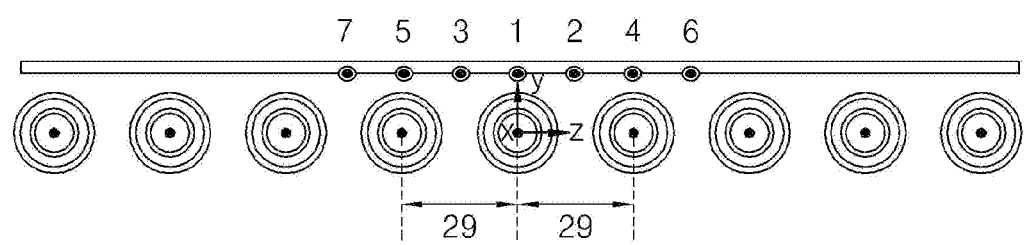
FIG. 11 is a drawing for explanation of an experiment example to verify the effect of a substrate processing apparatus according to an embodiment of the present invention.

FIG. 11 is a drawing for explanation of an experiment example to verify the effect of a substrate processing apparatus according to an embodiment of the present invention.

Referring to FIG. 11, in the experiment, the main heat source was applied with energy of the same size, and a plurality of main heat source were isolated in predetermined manner. Under this state, the temperature of the substrate was measured with changing the distance y from the center of the main heat source to the substrate surface. Here, the temperature at the substrate surface was measured with increasing the distance y from the center of the main heat source to the substrate surface by 5 mm each time, and the result is shown in the TABLEs 1 to 4 below:

TABLE 1

| x [mm] | y [mm] | z [mm] | Temperature (Solid) [° C.] |
|---|---|---|---|
| 0 | 15 | −45 | 608.6388709 |
| 0 | 15 | −29 | 612.0091567 |
| 0 | 15 | −14.5 | 610.9078224 |
| 0 | 15 | 0 | 614.4185527 |
| 0 | 15 | 14.5 | 612.1254244 |
| 0 | 15 | 29 | 612.804982 |
| 0 | 15 | 45 | 608.7929474 |

TABLE 2

| x [mm] | y [mm] | z [mm] | Temperature (Solid) [° C.] |
|---|---|---|---|
| 0 | 20 | −45 | 601.3557594 |
| 0 | 20 | −29 | 604.6016349 |
| 0 | 20 | −14.5 | 604.6116485 |
| 0 | 20 | 0 | 605.4251035 |
| 0 | 20 | 14.5 | 605.6039862 |
| 0 | 20 | 29 | 604.8385773 |
| 0 | 20 | 45 | 600.7663645 |

TABLE 3

| x [mm] | y [mm] | z [mm] | Temperature (Solid) [° C.] |
|---|---|---|---|
| 0 | 25 | −45 | 593.1026869 |
| 0 | 25 | −29 | 596.3149195 |
| 0 | 25 | −14.5 | 597.7101467 |
| 0 | 25 | 0 | 598.3923215 |
| 0 | 25 | 14.5 | 598.0394516 |
| 0 | 25 | 29 | 596.3718549 |
| 0 | 25 | 45 | 593.6776642 |

TABLE 4

| x [mm] | y [mm] | z [mm] | Temperature (Solid) [° C.] |
|---|---|---|---|
| 0 | 30 | −45 | 585.7124988 |
| 0 | 30 | −29 | 588.8582712 |
| 0 | 30 | −14.5 | 590.3405864 |
| 0 | 30 | 0 | 590.5829956 |
| 0 | 30 | 14.5 | 589.3832914 |
| 0 | 30 | 29 | 587.7137974 |
| 0 | 30 | 45 | 584.2947854 |

Referring to TABLE 1 to TABLE 4 above, it is noted that, as the distance y from the center of the main heat source to the substrate surface increases, the temperature of the substrate surface when processing the substrate gets low. And it is noted that, when the spacing z between the main heat sources is identical, and every time when the distance from the main heat source to the substrate surface increases by 5 mm, the temperature measured at the same point of the substrate, for example, point '1' in FIG. 11 decreases by about 5 to 8° C. In other words, it is shown that the temperature of the substrate increases as the distance from the main heat source to the substrate surface decrease. Therefore, it is noted that in the case where the main heat source is arranged to pass through the frame consisting the chamber as in the present invention, the substrate can be heated up effectively with effectively reduced distance between the substrate and the main heat source.

Every term or word used in the specification and claim should not be confined or interpreted to a meaning of day life or of dictionary, and should be translated to the meaning and concept in coincidence with the technical idea of the invention, based on a principle that an inventor can define a concept of a term properly to describe the invention in a best way.

<Description of Symbols>

| | |
|---|---|
| 100: chamber | 110: base frame |
| 120: block | 132: main heat source |
| 200: substrate support portion | 250, 350: substrate support stanchion |
| 252: upper plate | 262: lower plate |
| 270: rod | 280: first fixing member |
| 290: second fixing member | |

What is claimed is:

1. A substrate processing apparatus, comprising:
a chamber having a space to process the substrate therein; and
a substrate support portion provided in the chamber and configured to support the substrate;
wherein the chamber comprises:
an upper frame with a shape of polygon frame,
a lower frame with a shape corresponding to the upper frame,
a plurality of side frames comprising two vertical frames connecting each of both end portions of the upper frame and the lower frame and extending longitudinally with being faced with each other and two horizontal frames connecting the two vertical frames with each other and extending horizontally,
an upper block connected to the upper frame to form the space for processing the substrate, the upper block having an opening,
a lower block connected to the lower frame to form the space for processing the substrate, a plurality of side blocks connected to the side frames to form the space to process the substrate,
a plurality of light-transmitting tubes provided across the side frames, and
a plurality of main heat sources inserted into corresponding ones of the plurality of light-transmitting tubes,
the apparatus further comprising an auxiliary heat source unit which comprises:
a supporting plate connected with the opening of the upper block,
a plurality of light-transmitting tubes connected with the supporting plate and the lower block in a direction crossing with the plurality of main heat sources and provided to surround the substrate supporting portion, and
a plurality of auxiliary heat sources which are inserted into corresponding ones of the plurality of light-transmitting tubes connected with the supporting plate and the lower block,
wherein the substrate support portion can support the substrate in the form of a roll such that the substrate support portion is surrounded by the substrate,
wherein the plurality of auxiliary heat sources are disposed between the plurality of main heat sources and the substrate support portion to surround the substrate support portion and heat the whole area of the substrate at the same distance, and
wherein fixing holes are radially formed in each of the supporting plate and the lower block to fix the plurality of light-transmitting tubes for inserting the plurality of auxiliary heat sources;
wherein the substrate support portion comprises a substrate support stanchion supporting the substrate, the substrate support stanchion comprising:
at least one fixing member which is connected to an upper plate and a lower plate and fixes the substrate to enclose a body, wherein the at least one fixing member comprises:
at least one fixing rod which connects the upper plate and the lower plate to each other, wherein fixing holes, isolated along a longitudinal direction of the at least one fixing rod, are formed within the at least one fixing rod, and
a fixing pin which is inserted into the fixing holes and fixes the other side of the substrate.

2. A substrate processing apparatus according to claim 1, wherein, the supporting plate is provided with an inflow hole for gas to flow in the chamber.

3. A substrate processing apparatus according to claim 1, wherein,
the lower block is connected to a bottom portion of the lower frame, and
a through hole is formed at a center portion of the lower frame to connect to a gate which supports the substrate support portion and is opened and closed when the substrate is imported and exported.

4. A substrate processing apparatus according to claim 1, wherein one or more of the plurality of main heat sources is provided to cut across inside of one or more of the plurality of side frames.

5. A substrate processing apparatus according to claim 4, wherein,
the plurality of main heat sources are provided at a different height from each other to a one or more of the plurality of main heat sources provided on a neighboring side frame of the plurality of side frames, each of the plurality of main heat source comprise a lamp emitting radiation light upon applying power or a heating element generating heat upon applying power,
wherein the plurality of main heat sources are provided at a different height from each other to a main heat source provided on a neighboring side frame.

6. A substrate processing apparatus according to claim 5, the substrate support portion further comprising:
a stand on one side of which the substrate support stanchion is received,
a support shaft which is provided as passing through a gate and supports the stand in the chamber being connected to the other side of the stand, and
an actuator which is provided outside of the chamber and rotates the support shaft.

7. A substrate processing apparatus according to claim 6, the substrate support stanchion further comprising:
an inflow hole for gas to be flowed in formed on the upper plate,
an outflow hole for gas to be discharged is formed on the lower plate,
wherein the lower plate is arranged as being isolated from the upper plate, and wherein the body comprises a rod which connects the upper plate and the lower plate each other.

8. A substrate processing apparatus according to claim 7, the at least one fixing member comprising:
   a first fixing member which is arranged substantially parallel to the rod and both ends of which is fixed to an outer side of the upper plate and the lower plate each, and
   a second fixing member which is provided with isolation to the first fixing member and both ends of which is fixed to an outer side of the upper plate and the lower plate each.

9. A substrate processing apparatus according to claim 8, the first fixing member comprising:
   a pair of second fixing rods, and
   an isolation member provided between the pair of second fixing rods,
   wherein a gap being formed between the pair of second fixing rods into which one side of the substrate is inserted.

10. A substrate processing apparatus according to claim 9, the second fixing member comprising:
    a third fixing rod in which the plurality of fixing holes are formed.

11. A substrate processing apparatus according to claim 10, wherein, the second fixing member is connected to be able to move along at least a part of a circumferential direction of the upper plate and the lower plate.

12. A substrate processing apparatus according to claim 6, the substrate support stanchion further comprising:
    an inflow hole for gas to be flowed in formed on the upper plate,
    an outflow hole for gas to be discharged is formed on the lower plate, and
    wherein the body comprises a rod which connects the upper plate and the lower plate each other and on which a slit is formed for one side of the substrate to be inserted along longitudinal direction.

13. A substrate processing apparatus according to claim 12, wherein,
    the rod is connected to either one of the upper plate and the lower plate to be able to be rotated.

14. A substrate processing apparatus according to claim 13, wherein,
    the at least one fixing member is connected to be able to move along at least a part of a circumferential direction of the upper plate and the lower plate.

15. A substrate processing apparatus according to claim 14, wherein,
    a discharge hole for gas to be discharged is formed on the stand.

* * * * *